United States Patent
Moon et al.

(10) Patent No.: US 12,044,936 B1
(45) Date of Patent: Jul. 23, 2024

(54) ARRAY SUBSTRATE COMPRISING A FIRST SUBPIXEL UNIT HAVING ONE OF A PLURALITY OF FIRST ELECTRODES AND A SECOND SUBPIXEL UNIT HAVING TWO OF A PLURALITY OF THIRD ELECTRODES AND LCD PANEL

(71) Applicant: Guangzhou China Star Optoelectronics Semiconductor Display Technology Co., LTD., Guangdong (CN)

(72) Inventors: Jongwon Moon, Guangdong (CN); Qingjuan Wang, Guangdong (CN); Qiuyue Wu, Guangdong (CN)

(73) Assignee: Guangzhou China Star Optoelectronics Semiconductor Display Technology Co., LTD., Guangzhou (CN)

( * ) Notice: Subject to any disclaimer, the term of this patent is extended or adjusted under 35 U.S.C. 154(b) by 0 days.

(21) Appl. No.: 18/509,378

(22) Filed: Nov. 15, 2023

(30) Foreign Application Priority Data

May 15, 2023 (CN) .......................... 202310549210.5

(51) Int. Cl.
*G02F 1/1343* (2006.01)
*H01L 27/12* (2006.01)

(52) U.S. Cl.
CPC ...... *G02F 1/134372* (2021.01); *H01L 27/124* (2013.01)

(58) Field of Classification Search
CPC ..................................................... G02F 1/1676
See application file for complete search history.

(56) References Cited

U.S. PATENT DOCUMENTS

| 2013/0135546 A1* | 5/2013 | Wang .................. H01L 33/0041 349/33 |
| 2015/0212372 A1* | 7/2015 | Moon ............... G02F 1/133707 349/139 |
| 2019/0094637 A1* | 3/2019 | Liu ..................... G02F 1/134336 |
| 2019/0271878 A1* | 9/2019 | Tsuruda ................... G02F 1/153 |
| 2020/0041851 A1* | 2/2020 | Qi .......................... G02F 1/1368 |

* cited by examiner

*Primary Examiner* — Paul C Lee

(57) ABSTRACT

Provided are an array substrate and a liquid crystal display panel. The array substrate includes first subpixel units and second subpixel units. A first electrode layer of the array substrate includes first electrodes, and each first subpixel unit is provided with the first electrode therein. A second electrode layer of the array substrate is disposed on the first electrode layer, and the second electrode layer includes second electrodes and third electrodes. Each first subpixel unit is provided with the second electrode(s), and each second subpixel unit is provided with two third electrodes arranged at intervals. In each first subpixel unit, ones of the first electrode and the second electrode(s) are pixel electrodes, and the other ones are common electrodes; and in each second subpixel unit, one of the two third electrodes is a pixel electrode, and the other is a common electrode.

18 Claims, 3 Drawing Sheets

ARRAY SUBSTRATE COMPRISING A FIRST SUBPIXEL UNIT HAVING ONE OF A PLURALITY OF FIRST ELECTRODES AND A SECOND SUBPIXEL UNIT HAVING TWO OF A PLURALITY OF THIRD ELECTRODES AND LCD PANEL

CROSS-REFERENCE TO RELATED APPLICATION

This application claims priority of Chinese Patent Application No. 202310549210.5 filed on May 15, 2023, the contents of which are incorporated by reference as if fully set forth herein in their entirety.

TECHNICAL FIELD

The present disclosure relates to the field of display technologies, and in particular, to an array substrate and a liquid crystal display (LCD) panel.

BACKGROUND

In a LCD panel with a fringe field switching (FFS) display mode, the LCD panel includes top electrodes and bottom electrodes. The top electrodes are disposed separately correspondingly to subpixels, the bottom electrodes are together on a whole surface, and an electric field is formed between the top electrodes and the bottom electrodes to drive a liquid crystal to work. The FFS display mode has a higher transmittance. However, due to a strong electric field, a large bending degree of the liquid crystal and obvious flexoelectric effect in the FFS display mode, it is easy to cause the problem of displaying a residual image on the LCD panel.

Therefore, existing LCD panels have a technical problem that it cannot achieve both higher transmittance and no display residual image, and need to be improved.

SUMMARY

According to embodiments of the present disclosure, it is provided an array substrate and a LCD panel, which are used for alleviating the technical problem that the existing LCD panels cannot achieve both higher transmittance and no display residual image.

According to embodiments of the present disclosure, it is provided an array substrate, including multiple first subpixel units and multiple second subpixel units, the array substrate further includes: a first electrode layer including a plurality of first electrodes, where each of the plurality of first subpixel units is provided with one of the first electrodes; and a second electrode layer disposed on the first electrode layer, where the second electrode layer includes a plurality of second electrodes and a plurality of third electrodes, each of the plurality of first subpixel units is provided with one or more of the second electrodes, and each of the plurality of second subpixel units is provided with two of the third electrodes which are spaced apart; where in each of the first subpixel units, ones of the first electrode and the one or more second electrodes are pixel electrodes, and other ones of the first electrode and the one or more second electrodes are common electrodes; in each of the second subpixel units, one of the two third electrodes is another pixel electrode, and an other of the two third electrodes is another common electrode.

In some embodiments, each of the first subpixel units is provided with at least two of the one or more second electrodes which are spaced apart, and the at least two second electrodes are the pixel electrodes or the at least two second electrodes are the common electrodes.

In some embodiments, at a junction of the first subpixel unit and the second subpixel unit adjacent to each other, one of the at least two second electrodes in the first subpixel unit and one of the two third electrodes in the second subpixel unit adjacent to the first subpixel unit are interconnected, and are the pixel electrodes or the common electrodes.

In some embodiments, in a first direction, at least two of the plurality of second subpixel units are disposed between adjacent two of the plurality of first subpixel units; and at a junction of adjacent two of the at least two second subpixel units, one of the two third electrodes in one of the adjacent two second subpixel units and one of the two third electrodes in an other of the adjacent two second subpixel units are interconnected, and are each the another pixel electrode or the another common electrode.

In some embodiments, in a first direction, an even number of the plurality of second subpixel units are disposed between adjacent two of the plurality of first subpixel units; and the one or more second electrodes in each of the adjacent two first subpixel units are the pixel electrodes, and the first electrodes in the adjacent two first subpixel units are the common electrodes; or, the one or more second electrodes in each of the adjacent two first subpixel units are the common electrodes, and the first electrodes in the adjacent two first subpixel units are pixel electrodes.

In some embodiments, in a first direction, an odd number of the plurality of second subpixel units are disposed between adjacent two of the plurality of first subpixel units, the one or more second electrodes of one of the adjacent two first subpixel units are the pixel electrodes, the first electrode of the one of the adjacent two first subpixel units is one of the common electrodes, and the one or more second electrodes of an other of the adjacent two first subpixel units are the common electrodes, and the first electrode of the other of the adjacent two first subpixel units is one of the pixel electrodes.

In some embodiments, the plurality of first subpixel units and the plurality of second subpixel units are arranged in a manner of multi-row subpixel units along a second direction; and each row of the multi-row subpixel units includes ones of the plurality of first subpixel units and ones of the plurality of second subpixel units arranged in a first direction and having a same arrangement.

In some embodiments, ones of the plurality of first electrodes correspond to respective ones, which are in each column, of the plurality of first subpixel units, and are interconnected.

In some embodiments, in a second direction, an odd number of the plurality of second subpixel units are disposed between adjacent two of the first subpixel units; and the one or more second electrodes of one of the adjacent two first subpixel units are the pixel electrodes, the first electrode of the one of the adjacent two first subpixel units is one of the common electrodes; the one or more second electrodes of an other of the adjacent two first subpixel units are the common electrodes, and the first electrode of the other of the adjacent two first subpixel units is one of the pixel electrodes.

According to some embodiments of the present disclosure, it is also provided a LCD panel, which includes the array substrate mentioned above.

Beneficial effects are as follows. According to embodiments of the present disclosure, it is provided an array substrate and a liquid crystal display panel, where the includes first subpixel units and second subpixel units, and the array substrate further includes a first electrode layer and a second electrode layer. The first electrode layer includes first electrodes, and each first subpixel unit is provided with the first electrode therein. The second electrode layer is disposed on the first electrode layer, and the second electrode layer includes second electrodes and third electrodes. Each first subpixel unit is provided with second electrode(s), and each second subpixel unit is provided with two third electrodes spaced apart. In each first subpixel unit, ones of the first electrode and the second electrode (s) are pixel electrodes, and other ones of the first electrode and the second electrode(s) are common electrodes; and in each second subpixel unit, one of the two third electrodes is a pixel electrode, and the other of the two third electrodes is a common electrode. In the array substrate of the present disclosure, ones of the first electrode and the second electrode(s) disposed in different layers in the first subpixel unit are the pixel electrodes, and the other ones of the first electrode and the second electrode(s) disposed in different layers in the first subpixel unit are the common electrodes, so the FFS display mode can be formed in the first subpixel unit. One of the two third electrodes disposed in the same layer in the second subpixel unit is a pixel electrode, and the other of the two third electrodes disposed in the same layer in the second subpixel unit is a common electrode, therefore, an in plane switching (IPS) display mode can be formed in the second subpixel unit. Since the transmittance in the FFS display mode is relatively higher and a flexoelectric effect of the liquid crystal in the IPS display mode is relatively lower, and there is no overlap between the first electrode and the third electrodes in the second subpixel unit, overlapping areas of the first electrode layer and the second electrode layer are reduced and the transmittance is increased. As such, in embodiments of the present disclosure, by setting the two display modes in the same array substrate, the transmittance is improved compared with the single display mode of IPS. Further, the flexoelectric effect of the liquid crystal is reduced compared with the single display mode of FFS. In this way, the problem of displaying residual image can be improved while achieving higher transmittance.

BRIEF DESCRIPTION OF THE DRAWINGS

The following detailed description of specific embodiments of the present disclosure in conjunction with accompanying drawings will make technical solutions and other beneficial effects of the present disclosure apparent.

DETAILED DESCRIPTION

Figure 1:
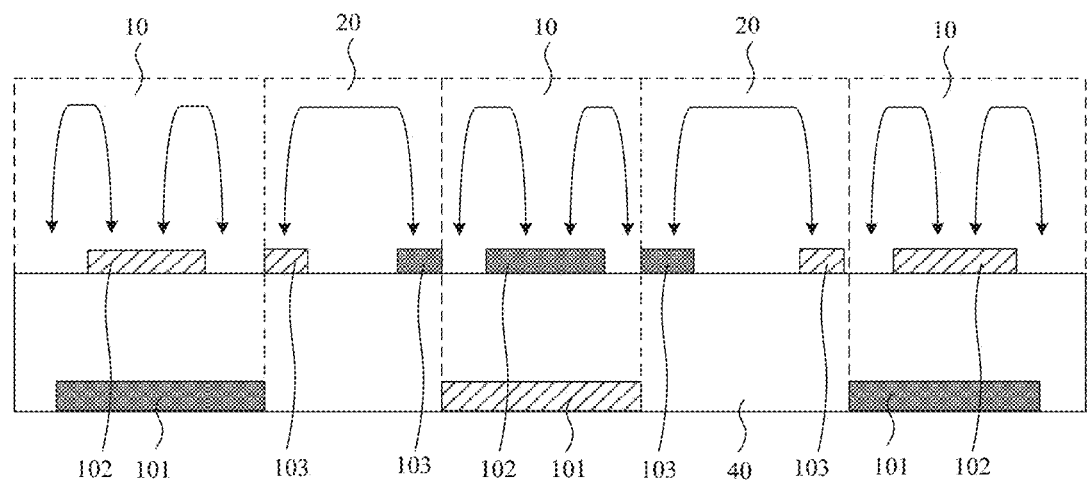
FIG. 1 is a sectional diagram of a partial structure of a first film structure of an array substrate provided by an embodiment of the present disclosure.

Technical solutions in embodiments of the present disclosure will be described clearly and completely in conjunction with the accompanying drawings in the embodiments of the present disclosure. Apparently, the described embodiments are only some of the embodiments of the present disclosure, and not all of them. Based on the embodiments in the present disclosure, all other embodiments obtained by those skilled in the art without creative work will fall within the scope of protection of the present disclosure.

In the description of the present disclosure, it should be understood that orientation or positional relationships indicated by the terms "center", "longitudinal", "transverse", "length", "width", "thickness", "upper", "lower", "front", "back", "left", "right", "vertical", "horizontal", "top", "bottom", "inside", "outside", "clockwise", "counterclockwise" and the like indicate are based on the orientation or positional relationships shown in the accompanying drawings, and the terms are merely intended to facilitate the description of the present disclosure and simplify the description, not to indicate or imply that the device or element referred to must have a particular orientation, be constructed and operated in a particular orientation, and therefore the term are not to be construed as a limitation of the present disclosure. Furthermore, the terms "first" and "second" are merely used for descriptive purposes, and are not to be understood as indicating or implying relative importance or implicitly specifying the number of technical features indicated. Therefore, features defined with "first" and "second" may expressly or implicitly include one or more described features. In the description of the present disclosure, the term "multiple" means two or more, unless otherwise expressly and specifically limited.

In the description of the present disclosure, it should be noted that unless otherwise expressly specified and limited, the terms "installation", "connected" and "connection" should be broadly understood, for example, they may be fixedly connected, detachably connected, or integrally connected; may be mechanically connected, electrically connected, or capable of communicating with each other; may be directly connected or indirectly connected through an intermediate medium, or may be the internal connection of two elements or the interaction between two elements. For those skilled in the art, the specific meanings of the above terms in the present disclosure can be understood according to the specific circumstances.

In the present disclosure, unless otherwise expressly specified and limited, a first feature being "on" or "under" a second feature may indicate that there is a direct contact between the first feature and the second feature, or it may indicate that there is no direct contact between the first feature and the second feature, and the first feature and the second feature are directed through another feature therebetween. Furthermore, the first feature being "on", "above" and "over" the second feature may indicate that the first feature is directly above or diagonally above the second feature, or may simply indicate that the first feature is higher than the second feature in a horizontal height. The first feature being "under", "below", and "beneath" the second feature may indicate that the first feature is directly below or diagonally below the second feature, or may simply indicate that the first feature is lower than the second feature in horizontal height.

The following present disclosure provides many different embodiments or examples for implementing different structures of the present disclosure. In order to simplify the present disclosure, components and arrangements of specific embodiments are described below. Of course, they are only illustrated and are not intended to limit the present disclosure. Furthermore, the present disclosure may repeat reference numerals and/or reference letters in different embodiments, and such repetition is for the purpose of simplicity and clarity, and does not in itself indicate the relationship between the various embodiments and/or arrangements discussed. In addition, the present disclosure provides embodiments of various specific processes and materials, but those skilled in the art can realize the application of other processes and/or the use of other materials.

The embodiments of the present disclosure provide an array substrate and a LCD panel, which are used for alleviating the technical problem that the existing LCD panels cannot achieve both higher transmittance and no display residual image.

As shown in FIG. 1, an array substrate includes first subpixel units 10 and second subpixel units 20. The array substrate further includes a first electrode layer and a second electrode layer. The first electrode layer includes first electrodes 101, and each first subpixel unit 10 is provided with the first electrode 101 therein. The second electrode layer is disposed on the first electrode layer. The second electrode layer includes second electrodes 102 and third electrodes 103. Each first subpixel unit 10 is provided with the second electrode 102 therein, and each second subpixel unit 20 is provided with two third electrodes 103 spaced apart. In each first subpixel unit 10, one of the second electrode 102 and the first electrode 101 is a pixel electrode, and the other of the second electrode 102 and the first electrode 101 is a common electrode. In each second subpixel unit 20, one of the two third electrodes 103 is a pixel electrode, and the other of the two third electrodes 103 is a common electrode.

Figure 2:
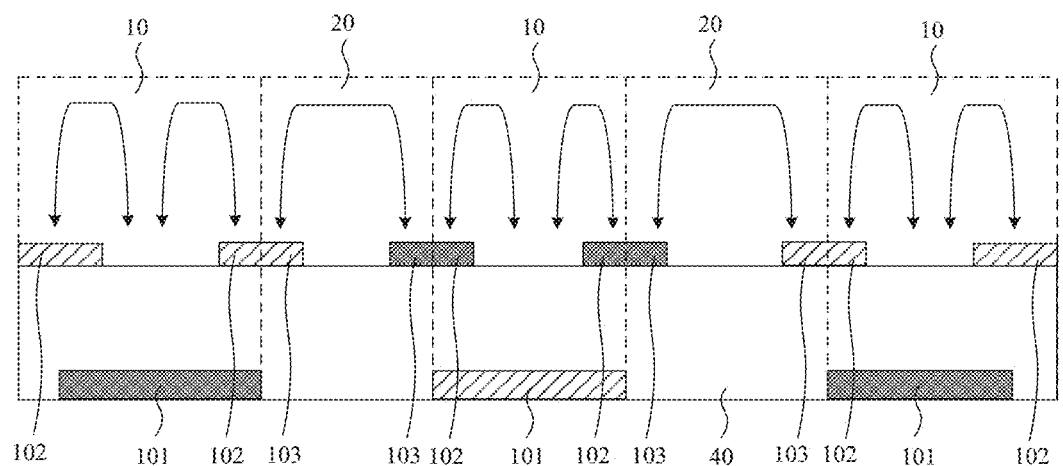
FIG. 2 is a sectional diagram of a partial structure of a second film structure of an array substrate provided by an embodiment of the present disclosure.
Figure 3:
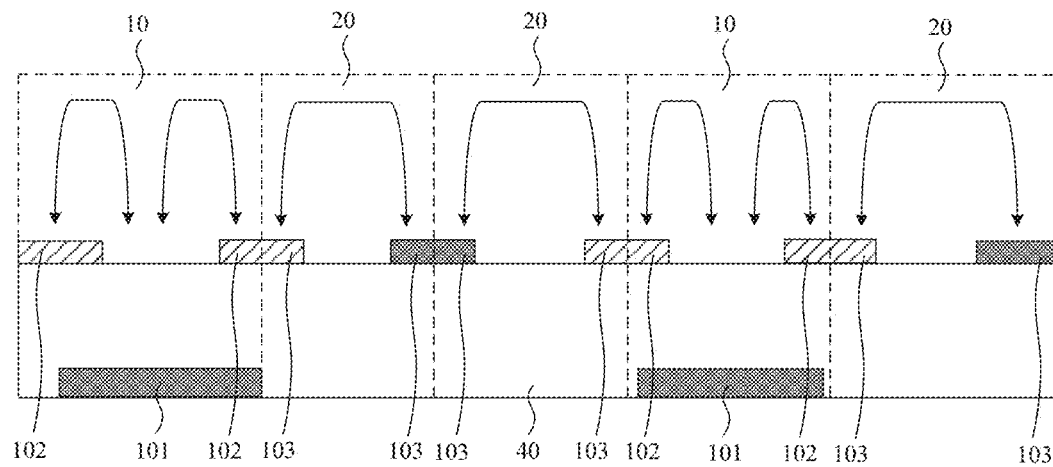
FIG. 3 is a sectional diagram of a partial structure of a third film structure of an array substrate provided by an embodiment of the present disclosure.
Figure 4:
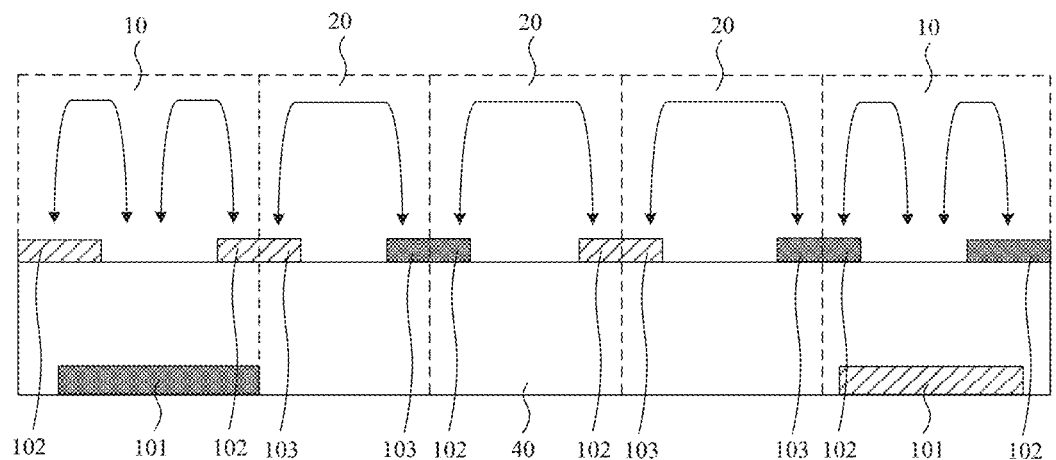
FIG. 4 is a sectional diagram of a partial structure of a fourth film structure of an array substrate provided by an embodiment of the present disclosure.

From the perspective of a plane structure, the array substrate includes pixel units arranged in an array, and each pixel unit includes subpixel units, such as red subpixel units, green subpixel units, and blue subpixel units. All subpixel units may be divided into first subpixel units 10 and second subpixel units 20 according to different display modes, and at least one second subpixel unit 20 may be disposed between any adjacent two first subpixel units 10. FIGS. 1 and 2 illustrate a case where one second subpixel unit 20 is arranged between adjacent two first subpixel units 10, FIG. 3 illustrates a case where two second subpixel units 20 are disposed between adjacent two first subpixel units 10, and FIG. 4 illustrates a case where three second subpixel units 20 are disposed between adjacent two first subpixel units 10.

From the perspective of a film structure, the array substrate includes a driving circuit layer (not shown), the first electrode layer, an insulating layer 40 and a second electrode layer sequentially in that order from bottom to top. The driving circuit layer includes thin film transistors, the thin film transistors define pixel driving circuits, and the pixel driving circuits each provide a driving voltage to an electrode in respective subpixel unit. The first electrode layer and the second electrode layer are insulated from each other by the insulating layer 40. The first electrode layer and the second electrode layer are made of transparent conductive materials, such as indium tin oxide (ITO), and the insulating layer 40 is made of an inorganic insulating material, such as silicon nitride or silicon oxide.

The first electrode layer includes first electrodes 101, and the number of the first electrodes 101 is the same as that of the first subpixel units 10, and each first subpixel unit 10 is provided with the first electrode 101 therein. The second electrode layer includes second electrodes 102 and third electrodes 103, and each first subpixel unit 10 is provided with the second electrode(s) 102. Ones of the first electrode 101 and the second electrode(s) 102 in each first subpixel unit 10 are pixel electrodes, and the other ones of the first electrode 101 and the second electrode(s) 102 are common electrodes. For example, as shown in FIG. 1, the first electrode 101 in a first one of first subpixel units 10 from left to right is a common electrode, and the second electrode 102 in the first one of first subpixel units 10 is a pixel electrode. The first electrode 101 in a second one of first subpixel units 10 from left to right is a pixel electrode, and the second electrode 102 in the first one of first subpixel units 10 is a common electrode. Each second subpixel unit 20 is provided with two third electrodes 103 therein, which are spaced apart with each other. One of the two third electrodes 103 is a pixel electrode, and the other of the two third electrodes 103 is a common electrode. For example, as shown in FIG. 1, the third electrode 103 on the left side in a first one of second subpixel units 20 from left to right is a pixel electrode, and the third electrode 103 on the right side in the first one of second subpixel units 20 is a common electrode. The third electrode 103 on the left side in a second one of second subpixel units 20 from left to right is a common electrode, and the third electrode 103 on the right side in the second one of second subpixel units 20 from left to right is a pixel electrode. The two third electrodes 103 may be both block structures, and the two block structures are arranged at intervals by a certain spacing to achieve the purpose of spacing. The two third electrodes 103 may respectively have comb-like structures, which are disposed intersected. That is to say, the two third electrodes 103 each include comb teeth, a gap is defined between adjacent two comb teeth of each third electrode 103, comb teeth of one third electrode 103 are disposed to correspond to the gaps of the other third electrode 103, and the comb teeth of the two third electrodes 103 are insulated from each other, so as to achieve the purpose of interval arrangement.

After the subsequent formation of the LCD panel, the pixel electrode(s) in the first subpixel unit 10 are each applied a pixel driving voltage, and the common electrode(s) in the first subpixel unit 10 are each applied a common driving voltage. Because the pixel electrode(s) and the common electrode(s) are located in different layers, an edge lateral electric field will be generated between them after the driving voltages are applied, and a direction of the edge lateral electric field is shown by an arrow in FIG. 1. As such, liquid crystals are controlled by the edge lateral electric field to rotate in a plane to realize image display. This arrangement constitutes a fringe field switching (FFS) display mode in the first subpixel unit 10. The pixel electrode in the second subpixel units 20 is applied the pixel driving voltage, and the common electrode in the second subpixel unit 20 is applied the common driving voltage. Because the pixel electrode and the common electrode are located on the same layer and there is no first electrode 101 below them, a horizontal electric field will be generated between them after the driving voltages are applied, and a direction of the horizontal electric field is shown by an arrow in FIG. 1. As such, liquid crystals are controlled by the horizontal electric field to rotate in a plane to realize image display. This arrangement constitutes an in plane switching (IPS) display mode in the second subpixel unit 20.

At present, in a LCD panel with a single FFS display mode, liquid crystals in each subpixel unit perform displaying based on the FFS display mode. In the single FFS display mode, the LCD panel has a higher transmittance. However, due to a strong electric field generated between the first electrode and the second electrode, a large bending degree of the liquid crystal, and obvious flexoelectric effect in the FFS display mode, it is easy to cause the problem of displaying a residual image on the LCD panel.

In contrast, in the array substrate of the present disclosure, ones of the first electrode and the second electrode(s) disposed in different layers in the first subpixel unit 10 are pixel electrodes, and the other ones of the second electrode(s) and the first electrode disposed in different layers in the first subpixel unit 10 are common electrodes. Therefore, a FFS display mode can be defined in the first subpixel unit. One of the two third electrodes disposed in the same layer in the second subpixel unit is a pixel electrode, and the other of the two third electrodes disposed in the same layer in the second subpixel unit is a common electrode. Therefore, an IPS display mode can be defined in the second subpixel unit. Since the transmittance in the FFS display mode is relatively higher and liquid crystal flexoelectric effect in the IPS display mode is relatively lower, in the present disclosure, by setting the two display modes in the same array substrate, the transmittance is improved compared with the single IPS display mode, and the liquid crystal flexoelectric effect is reduced compared with the single FFS display mode. As such, the problem of displaying residual image can be improved while achieving higher transmittance.

Figure 5:
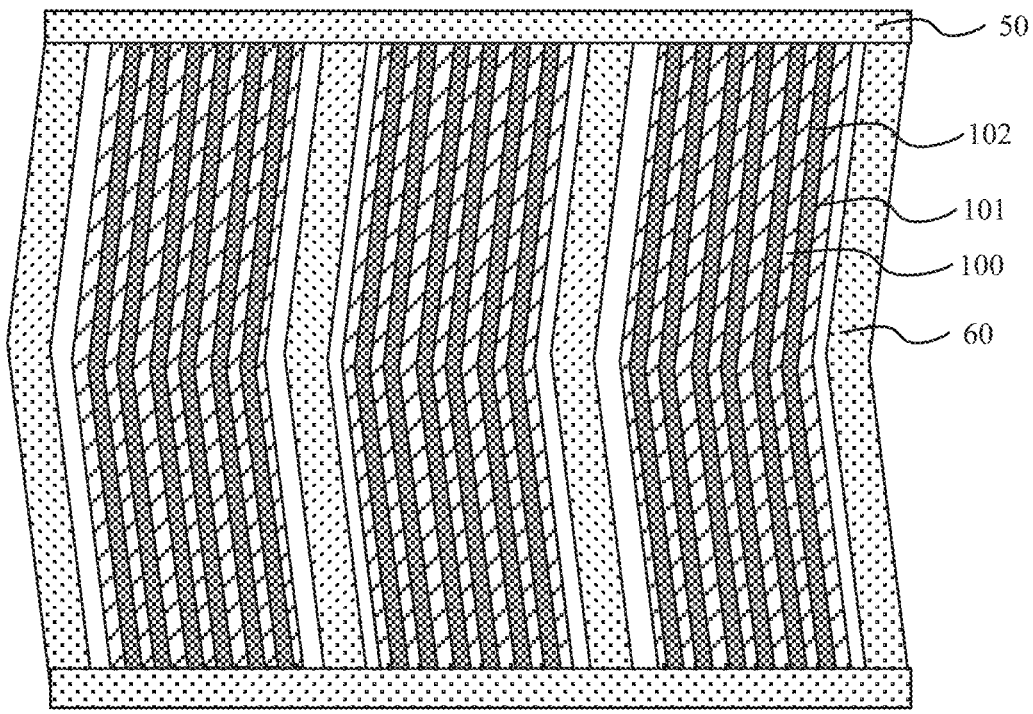
FIG. 5 is a schematic diagram of a partial plane structure of an array substrate in the related art.

In addition, a partial plane structure of an array substrate in an existing liquid crystal display panel with the single FFS display mode is shown in FIG. 5, which includes scanning lines 50 and data lines 60. The array substrate is divided into pixel units by the scanning lines 50 and the data lines 60, and each pixel unit includes three subpixel units. In FIG. 5, three subpixel units arranged from left to right are shown, and a second electrode 102 and a first electrode 101 are disposed in each subpixel unit. Specifically, in each pixel unit, the first electrode 101 is disposed as a whole, which covers the three subpixel units; and the second electrode 102 is more than one in number, which forms a slit structure. And, the slit structure includes multiple slits 100. When the first electrode 101 is a common electrode, the second electrodes 102 are pixel electrodes. When the first electrode 101 is a pixel electrode, the second electrodes 102 are common electrodes. In each pixel unit, the first electrode 101 and the second electrodes 102 are overlapped in each of three subpixel units.

In the array substrate of the embodiment of the present disclosure, because the first electrode 101 is arranged in the first subpixel unit 10, and there is no overlapping area between the first electrode 101 and the third electrodes 103 in the second subpixel unit 20, the overall overlapping areas of the first electrode layer and the second electrode layer are reduced. When a LCD panel is subsequently formed, the transmittance is further improved and the display brightness of the LCD panel is improved.

Figure 6:
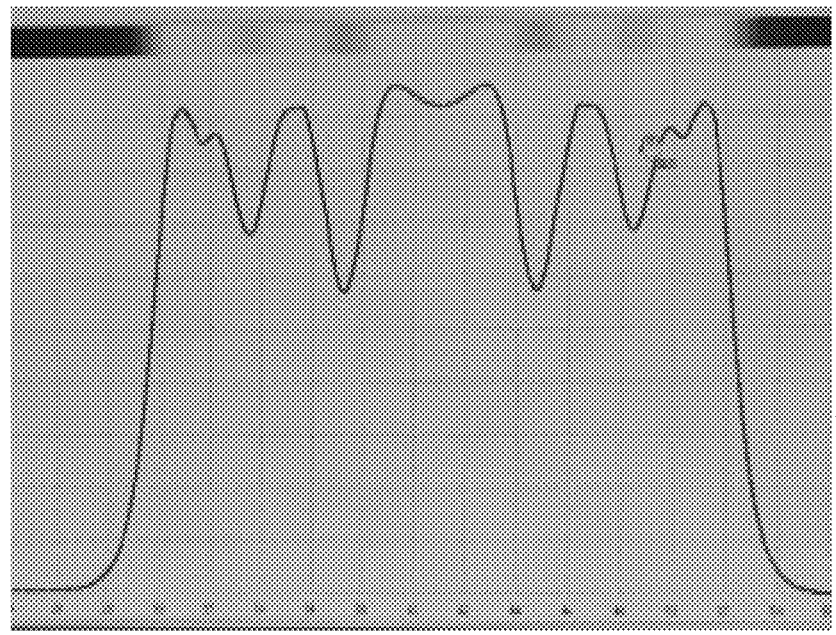
FIG. 6 is a schematic diagram of a simulation curve of a transmittance of an array substrate provided by an embodiment of the present disclosure.

As shown in FIG. 6, FIG. 6 illustrates a simulation curve of a transmittance of the first to third subpixel units in the array substrate shown in FIG. 2. From FIG. 6, it can be seen that a transmittance curve of the first subpixel unit and the third subpixel unit conform to the FFS display mode, and a transmittance curve of the second subpixel unit conforms to the IPS display mode. That is to say, the structure shown in FIG. 2 can achieve the design purpose of realizing the two display modes in the same LCD panel at the same time, thereby improving the problem of displaying residual image while achieving higher transmittance.

In an embodiment, at least two second electrodes 102 arranged at intervals are disposed in each first subpixel unit 10, and the at least two second electrodes 102 are pixel electrodes or common electrodes. In the structure shown in FIG. 1, only one second electrode 102 is disposed in the first subpixel unit 10. As shown in FIG. 2, two or more second electrodes 102 can be disposed at intervals in each first subpixel unit 10, a slit is defined between adjacent two second electrodes 102, and an edge lateral electric field will be generated between each second electrode 102 and the first electrode 101. In the structure shown in FIG. 2, the second electrodes 102 in each first subpixel unit 10 have the same electrical properties when working, and the pixel electrodes can be applied pixel driving voltages at the same time, or the common electrodes can be applied common driving voltages at the same time.

In an embodiment, at a junction of a first subpixel unit 10 and a second subpixel unit 20 adjacent to each other, one second electrode 102 in the first subpixel unit 10 and one third electrode 103 in the second subpixel unit 20 are interconnected, and the second electrode 102 and the third electrode 103 interconnected are pixel electrodes or common electrodes. As shown in FIG. 2, the first one of subpixel units from left to right is the first subpixel unit 10, and the second one of subpixel units from left to right is the second subpixel unit 20. At a junction of them, a second electrode 102 on the right side of the first subpixel unit 10 and a third electrode 103 on the left side of the second subpixel unit 20 are interconnected to form a whole, that is to say, they are prepared together by the same process during preparation. After the preparation, the part located in the first subpixel unit 10 acts as the second electrode 102, and the part located in the second subpixel unit 20 acts as the third electrode 103. Because the second electrode 102 on the right side of the first subpixel unit 10 and the third electrode 103 on the left side of the second subpixel unit 20 are a whole, they have the same electrical properties when working, and thus the both pixel electrodes can be applied pixel driving voltages at the same time, or the both common electrodes can be applied common driving voltages at the same time. For the first subpixel unit 10 and the second subpixel unit 20 adjacent to each other, when the second electrode 102 of the first subpixel unit 10 and the third electrode 103 of the second subpixel unit 20 are integrated as a whole, the second electrode 102 of the first subpixel unit 10 and the third electrode 103 of the second subpixel unit 20 can be applied the driving voltage through one connection point, so the solution in this embodiment can make the structure of the array substrate in the present disclosure simpler compared with a structure of applying the driving voltages through two connection points respectively.

In an embodiment, in a first direction, at least two second subpixel units 20 are disposed between adjacent two first subpixel units 10. At a junction of adjacent two second subpixel units 20 of the at least two second subpixel units 20, one third electrode 103 disposed in one of the adjacent two second subpixel units 20 and one third electrode 103 disposed in the other of the adjacent two second subpixel units 20 are interconnected, and the two interconnected third electrodes 103 are pixel electrodes or common electrodes. The array substrate includes pixel units which are arranged in an array, each pixel unit includes subpixel units, and an arrangement direction of the subpixel units in each pixel unit is the first direction. Specifically, the first direction may be a horizontal direction. As shown in FIG. 3, the first one of subpixel units and the fourth one of subpixel units from left to right are adjacent two first subpixel units 10, the second one of subpixel units from left to right is a second subpixel unit 20, and the third one of subpixel units from left to right is also a second subpixel unit 20. At a junction of adjacent two second subpixel units 20, a third electrode 103 on the right side of the left second subpixel unit 20 and a third electrode 103 on the left side of the right second subpixel unit 20 are interconnected to form a whole, that is to say, they are prepared together by the same process during preparation. After the preparation, the part disposed in the left second subpixel unit 20 and the part located in the right second subpixel unit 20 act as two third electrodes 103 respectively. Because the third electrode 103 on the right side of the left second subpixel unit 20 and the third electrode 103 on the left side of the right second subpixel unit 20 are a whole, they have the same electrical properties when working. Thus, the both pixel electrodes can be applied pixel driving voltages at the same time, or the both common electrodes can be applied common driving voltages at the same time. When the two third electrodes 103 of the adjacent two second subpixel units 20 are integrated as a whole, they can be applied the driving voltages through one connection point, so the solution in this embodiment can make the structure of the array substrate in the present disclosure simpler compared with a structure of applying the driving voltages through two connection points respectively.

In an embodiment, in the first subpixel unit 10, widths of the two second electrodes 102 are each in a range from 1.50 microns to 3.0 microns, a spacing between the two second electrodes 102 is in a range from 1.5 microns to 6.0 microns, and a width of the first electrode 101 is in a range from 3 microns to 10 microns. When these values are set, the transmittance in the first subpixel unit 10 can be made larger, and at the same time, the generated electric field can meet the requirements of liquid crystal deflection. In the second subpixel unit 20, widths of the two third electrodes 103 are each in a range from 1.5 microns to 3.0 microns, and a spacing between the two third electrodes 103 is in a range from 3 microns to 10 microns. When these values are set, the generated electric field can meet the requirements of liquid crystal deflection, and at the same time, obvious flexoelectric effect will be not produced, and a large transmittance in the second subpixel unit 20 can be ensured.

In an embodiment, in the first subpixel unit 10, a center of the first electrode 101 is aligned with a center of the first subpixel unit 10, and the at least two second electrodes 102 are uniformly distributed in the first subpixel unit 10. The center alignment makes the whole first electrode 101 uniformly distributed in the first subpixel unit 10, and the second electrodes 102 are uniformly distributed in the first subpixel unit 10. Therefore, the electric field generated between the second electrodes 102 and the first electrode 101 in the first subpixel unit 10 can be relatively uniform, and the influence on liquid crystal deflection is relatively even, thereby achieving better display effect.

In an embodiment, in the first direction, an even number of second subpixel units 20 are disposed between adjacent two first subpixel units 10. The second electrodes 102 in the adjacent two first subpixel units 10 are pixel electrodes, and the first electrodes 101 in the adjacent two first subpixel units 10 are common electrodes; or, the second electrodes 102 in the adjacent two first subpixel units 10 are common electrodes, and the first electrodes 101 in the adjacent two first subpixel units 10 are pixel electrodes.

In the first direction, when the even number of second subpixel units 20 are disposed, as shown in FIG. 3, in second subpixel units 20 at odd-numbered positions from left to right, such as the first one, the third one, and the like in all second subpixel units, the third electrodes 103 on the left sides are pixel electrodes and the third electrodes 103 on the right sides are common electrodes. In second subpixel units 20 at even-numbered positions from left to right, such as the second one, the fourth one, and the like in all second subpixel units, the third electrodes 103 on the left sides are common electrodes and the third electrodes 103 on the right sides are pixel electrodes. Alternatively, in another condition, in second subpixel units 20 at odd-numbered positions from left to right, such as the first one, the third one, and the like in the all second subpixel units, the third electrode 103 on the left sides are common electrodes and the third electrodes on the right sides are pixel electrodes; and in second subpixel units 20 at even-numbered positions from left to right, such as the second one, the fourth one, and the like in all the second subpixel units, the third electrodes 103 on the left sides are pixel electrodes and the third electrodes on the right sides are common electrodes.

In one of the above two conditions, an electrical property of the second electrode 102 in the first subpixel unit 10 on the left side of an even number of second subpixel units 20 needs to be the same as that of a left third electrode 103 in second subpixel unit 20 at the odd-numbered position. In another of the above two conditions, an electrical property of the second electrode 102 in the first subpixel unit 20 on the right side of the even number of second subpixel units 20 needs to be the same as that of a right third electrode 103 in the second subpixel unit 20 at the even-numbered position. Therefore, in the first case, the second electrodes 102 in the adjacent two first subpixel units 10 are pixel electrodes, and the first electrodes 101 are common electrodes. In the second case, the second electrodes 102 in the two first subpixel units 10 are common electrodes, and the first electrodes 101 are pixel electrodes.

In an embodiment, in the first direction, an odd number of second subpixel units 20 are disposed between adjacent two first subpixel units 10. In the adjacent two first subpixel units 10, the second electrode 102 of one of the adjacent two first subpixel units 10 is a pixel electrode, and the first electrode 101 of the one of the adjacent two first subpixel units 10 is a common electrode. And, the second electrode 102 of the other of the adjacent two first subpixel units 10 is a common electrode, and the first electrode 101 of the other of the adjacent two first subpixel units 10 is a pixel electrode.

When the odd number of second subpixel units 20 are disposed, as shown in FIGS. 1, 2 and 4, in second subpixel units 20 at odd-numbered positions from left to right, such as the first one, the third one, the fifth one, and the like in all the second subpixel units 20, the third electrode 103 on the left sides are pixel electrodes, and the third electrodes 103 on the right sides are common electrodes. In second subpixel units 20 at even-numbered positions from left to right, such as the second one, the fourth one, and the like in all the second subpixel units 20, the third electrodes 103 on the left sides are common electrodes and the third electrodes 103 on the right sides are pixel electrodes.

In the above two conditions, an electrical property of the second electrode 102 in the first subpixel unit 10 on the left side of an odd number of second subpixel units 20 needs to be the same as that of a lest third electrode 103 in the second subpixel unit 20 at the odd-numbered position; an electrical property of the second electrode 102 in the first subpixel unit 10 on the right side of the odd number of second subpixel units 20 needs to be the same as that of a right third electrode 103 in the next second subpixel unit 20 at the odd-numbered position. Therefore, for the adjacent two first subpixel units 10, in the first case, the second electrodes 102 in the left first sub-pixel unit 10 are pixel electrodes, the first electrode 101 is a common electrode in the left first sub-pixel unit 10, the second electrodes 102 in the right first sub-pixel unit 10 are common electrodes, and the first electrode 101 in the right first sub-pixel unit 10 is a pixel electrode. In the second case, the second electrodes 102 in the left first sub-pixel unit 10 are common electrodes, the first electrode 101 in the left first sub-pixel unit 10 is a pixel electrode, the second electrodes 102 in the right first sub-pixel unit 10 are pixel electrodes, and the first electrode 101 in the right first sub-pixel unit 10 is a common electrode.

When the odd number of second subpixel units 20 is disposed, because an electrical property of the first electrode 101 in the first subpixel unit 10 on the left side of the odd number of second subpixel units 20 are different from that of the first electrode 101 in the first subpixel unit 10 on the right side of the odd number of second subpixel units 20, a remained charge in the first electrode 101 of the first subpixel unit 10 on the left side of the odd number of second subpixel units 20 can cancel out a remained charge in the first electrode 101 of the first subpixel unit 10 on the right side of the odd number of second subpixel units 20, thereby making the adjustment of the optimal common voltage more stable and getting better effect on improving residual image. When only one second subpixel unit 20 is disposed between adjacent two first subpixel units 10, for example, when the structure shown in FIG. 2 is adopted, the improvement effect is the best.

In an embodiment, the array substrate includes rows of subpixel units arranged in a second direction, each row of subpixel units includes first subpixel units 10 and second subpixel units 20 arranged in the first direction, and arrangement manners of the first subpixel units 10 and the second subpixel unit 20 in the rows of subpixel units are each the same. The first direction can be horizontal, and the second direction can be vertical. Each row of subpixel units includes multiple subpixel units. An arrangement manner of first subpixel units 10 and an arrangement manner of second subpixel units 20 in the subpixel units can adopt the arrangement manner described in any of the above embodiments. When the arrangement manners of subpixel units in rows are each the same, the preparation process is simpler.

In an embodiment, the first electrodes in each column of first subpixel units are interconnected. Each column of first subpixel units includes first subpixel units 10, and each of the first subpixel units 10 is provided with a first electrode 101. When the first electrodes 101 in each column of subpixel units are interconnected, that is, when the first electrodes 101 of the first subpixel units 10 in the same column are integrated together, the preparation process is enabled to be simpler and the structure of the array substrate is also enabled to be simpler.

In an embodiment, in the second direction, an odd number of second subpixel units 20 are disposed between adjacent two first subpixel units 10. In the adjacent two first subpixel units 10, the second electrode(s) 102 of one of the adjacent two first subpixel units 10 are pixel electrodes, a first electrode 101 of the one of the adjacent two first subpixel units 10 is a common electrode; the second electrode(s) 102 of the other of the adjacent two first subpixel units 10 are common electrodes, and the first electrode 101 of the other of the adjacent two first subpixel units 10 is a pixel electrode.

The array substrate includes rows of subpixel units, the rows of subpixel units are arranged in a second direction, and the second direction may be vertical. Similar to the solution principle of arranging an odd number of second subpixel units 20 between adjacent two first subpixel units 10 in the first direction, when an odd number of second subpixel units 20 are arranged between adjacent two first subpixel units 10 in the second direction, the two first electrodes 101 of the adjacent two first subpixel units 10 have different electrical properties. A remained charge in the first electrode 101 of the previous first subpixel unit 10 of the adjacent two first subpixel units 10 can cancel out a remained charge in the first electrode 101 of the next first subpixel unit 10 of the adjacent two first subpixel units 10, thereby making the adjustment of the optimal common voltage more stable and getting better effect on improving residual image. When only one second subpixel unit 20 is disposed between adjacent two first subpixel units 10 in the second direction, a spacing between the two first electrodes 101 is the smallest, and the improvement effect is the best.

In an embodiment of the present disclosure, in a first scheme, an odd number of second subpixel units 20 may be arranged only between adjacent two first subpixel units 10 in the first direction; in a second scheme, an odd number of second subpixel units 20 may be arranged only between adjacent two first subpixel units 10 in the second direction; in a third scheme, an odd number of second subpixel units 20 may be arranged between adjacent two first subpixel units 10 in the first direction and an odd number of second subpixel units 20 may be arranged between adjacent two first subpixel units 10 in the second direction. When the third scheme is adopted, the charge cancellation effect of the adjacent first electrodes 101 is better, thereby making the adjustment of optimal common voltage more stable and getting better effect on improving residual image.

Figure 7:
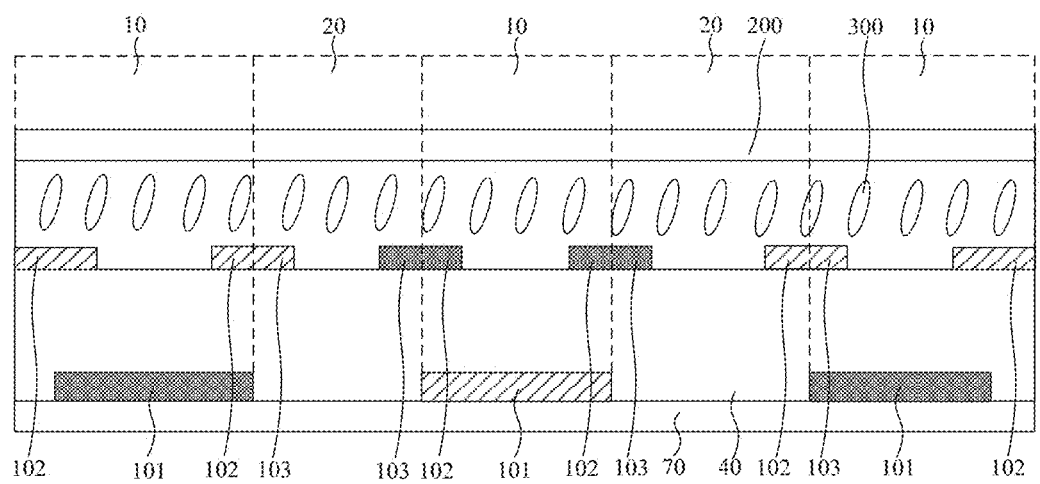
FIG. 7 is a sectional diagram of a partial structure of a LCD panel provided by an embodiment of the present disclosure.

The present disclosure also provides a LCD panel, which includes the array substrate described in any one of the above embodiments. As shown in FIG. 7, the LCD panel includes a counter substrate 200, a liquid crystal 300 and an array substrate described in any one of the above embodiments. The counter substrate 200 is relatively spaced apart from the array substrate, and the liquid crystal 300 is arranged between the counter substrate 200 and the array substrate. The array substrate sequentially includes a driving circuit layer 70, a first electrode layer, an insulating layer 40 and a second electrode layer in a direction towards the counter substrate 200. The LCD panel can be used for a smart watch, a tablet computer, a notebook computer, a personal computer (PC), a micro-processing box and other device with display functions. In the LCD panel provided by the present disclosure, two display modes, i.e., the FFS display mode and the IPS display mode, are set, so that the transmittance is improved compared with the single IPS display mode, and the liquid crystal flexelectric effect is reduced compared with the single FFS display mode. So, the problem of display residual image can be improved while achieving higher transmittance.

In the above-mentioned embodiments, the description of each embodiment has its own emphasis. For the parts not detailed in one embodiment, the relevant descriptions of other embodiments can be referred to.

The array substrates and the LCD panels provided by the embodiments of the present disclosure are described in detail above, and the principle and implementations of the present disclosure are explained by using specific examples.

However, the description of the above embodiments is merely intended to facilitate understanding of the technical solutions and core ideas of the present disclosure. Those skilled in the art should understand that they can still modify the technical solutions recorded in the above-mentioned embodiments, or replace some technical features with equivalents. Further, these modifications or substitutions do not make the essence of the corresponding technical solutions deviate from the scope of the technical solution of each embodiment of the present disclosure.

What is claimed is:

1. An array substrate comprising a plurality of first subpixel units and a plurality of second subpixel units, the array substrate further comprising:
   a first electrode layer comprising a plurality of first electrodes, wherein each of the plurality of first subpixel units is provided with one of the first electrodes; and
   a second electrode layer disposed on the first electrode layer, wherein the second electrode layer comprises a plurality of second electrodes and a plurality of third electrodes, each of the plurality of first subpixel units is provided with one or more of the second electrodes, and each of the plurality of second subpixel units is provided with two of the third electrodes which are spaced apart;
   wherein in each of the first subpixel units, ones of the first electrode and the one or more second electrodes are pixel electrodes, and other ones of the first electrode and the one or more second electrodes are common electrodes;
   in each of the second subpixel units, one of the two third electrodes is another pixel electrode, and an other of the two third electrodes is another common electrode.

2. The array substrate according to claim 1, wherein each of the first subpixel units is provided with at least two of the one or more second electrodes which are spaced apart, and the at least two second electrodes are the pixel electrodes or the at least two second electrodes are the common electrodes.

3. The array substrate according to claim 2, wherein at a junction of the first subpixel unit and the second subpixel unit adjacent to each other, one of the at least two second electrodes in the first subpixel unit and one of the two third electrodes in the second subpixel unit adjacent to the first subpixel unit are interconnected, and are the pixel electrodes or the common electrodes.

4. The array substrate according to claim 2, wherein in a first direction, at least two of the plurality of second subpixel units are disposed between adjacent two of the plurality of first subpixel units; and at a junction of adjacent two of the at least two second subpixel units, one of the two third electrodes in one of the adjacent two second subpixel units and one of the two third electrodes in an other of the adjacent two second subpixel units are interconnected, and are each the another pixel electrode or the another common electrode.

5. The array substrate according to claim 1, wherein in a first direction, an even number of the plurality of second subpixel units are disposed between adjacent two of the plurality of first subpixel units; and the one or more second electrodes in each of the adjacent two first subpixel units are the pixel electrodes, and the first electrodes in the adjacent two first subpixel units are the common electrodes; or, the one or more second electrodes in each of the adjacent two first subpixel units are the common electrodes, and the first electrodes in the adjacent two first subpixel units are pixel electrodes.

6. The array substrate according to claim 1, wherein in a first direction, an odd number of the plurality of second subpixel units are disposed between adjacent two of the plurality of first subpixel units, the one or more second electrodes of one of the adjacent two first subpixel units are the pixel electrodes, the first electrode of the one of the adjacent two first subpixel units is one of the common electrodes, and the one or more second electrodes of an other of the adjacent two first subpixel units are the common electrodes, and the first electrode of the other of the adjacent two first subpixel units is one of the pixel electrodes.

7. The array substrate according to claim 1, wherein the plurality of first subpixel units and the plurality of second subpixel units are arranged in a manner of multi-row subpixel units along a second direction; and each row of the multi-row subpixel units comprises ones of the plurality of first subpixel units and ones of the plurality of second subpixel units arranged in a first direction and having a same arrangement.

8. The array substrate according to claim 7, wherein ones of the plurality of first electrodes correspond to respective ones, which are in each column, of the plurality of first subpixel units, and are interconnected.

9. The array substrate according to claim 1, wherein in a second direction, an odd number of the plurality of second subpixel units are disposed between adjacent two of the first subpixel units; and the one or more second electrodes of one of the adjacent two first subpixel units are the pixel electrodes, the first electrode of the one of the adjacent two first subpixel units is one of the common electrodes; the one or more second electrodes of an other of the adjacent two first subpixel units are the common electrodes, and the first electrode of the other of the adjacent two first subpixel units is one of the pixel electrodes.

10. A liquid crystal display (LCD) panel, comprising an array substrate comprising a plurality of first subpixel units and a plurality of second subpixel units, the array substrate further comprising:
    a first electrode layer comprising a plurality of first electrodes, wherein each of the plurality of first subpixel units is provided with one of the first electrodes; and
    a second electrode layer disposed on the first electrode layer, wherein the second electrode layer comprises a plurality of second electrodes and a plurality of third electrodes, each of the plurality of first subpixel units is provided with one or more of the second electrodes, and each of the plurality of second subpixel units is provided with two of the third electrodes which are spaced apart;
    wherein in each of the first subpixel units, ones of the first electrode and the one or more second electrodes are pixel electrodes, and other ones of the first electrode and the one or more second electrodes are common electrodes;
    in each of the second subpixel units, one of the two third electrodes is another pixel electrode, and an other of the two third electrodes is another common electrode.

11. The LCD panel according to claim 10, wherein each of the first subpixel units is provided with at least two of the one or more second electrodes which are spaced apart, and the at least two second electrodes are the pixel electrodes or the at least two second electrodes are the common electrodes.

12. The LCD panel according to claim 11, wherein at a junction of the first subpixel unit and the second subpixel unit adjacent to each other, one of the at least two second electrodes in the first subpixel unit and one of the two third electrodes in the second subpixel unit adjacent to the first subpixel unit are interconnected, and are the pixel electrodes or the common electrodes.

13. The LCD panel according to claim 11, wherein in a first direction, at least two of the plurality of second subpixel units are disposed between adjacent two of the plurality of first subpixel units; and at a junction of adjacent two of the at least two second subpixel units, one of the two third electrodes in one of the adjacent two second subpixel units and one of the two third electrodes in an other of the adjacent two second subpixel units are interconnected, and are each the another pixel electrode or the another common electrode.

14. The LCD panel according to claim 10, wherein in a first direction, an even number of the plurality of second subpixel units are disposed between adjacent two of the plurality of first subpixel units; and the one or more second electrodes in each of the adjacent two first subpixel units are the pixel electrodes, and the first electrodes in the adjacent two first subpixel units are the common electrodes; or, the one or more second electrodes in each of the adjacent two first subpixel units are the common electrodes, and the first electrodes in the adjacent two first subpixel units are pixel electrodes.

15. The LCD panel according to claim 10, wherein in a first direction, an odd number of the plurality of second subpixel units are disposed between adjacent two of the plurality of first subpixel units, the one or more second electrodes of one of the adjacent two first subpixel units are the pixel electrodes, the first electrode of the one of the adjacent two first subpixel units is one of the common electrodes, and the one or more second electrodes of an other of the adjacent two first subpixel units are the common electrodes, and the first electrode of the other of the adjacent two first subpixel units is one of the pixel electrodes.

16. The LCD panel according to claim 10, wherein the plurality of first subpixel units and the plurality of second subpixel units are arranged in a manner of multi-row subpixel units along a second direction; and each row of the multi-row subpixel units comprises ones of the plurality of first subpixel units and ones of the plurality of second subpixel units arranged in a first direction and having a same arrangement.

17. The LCD panel according to claim 16, wherein ones of the plurality of first electrodes correspond to respective ones, which are in each column, of the plurality of first subpixel units, and are interconnected.

18. The LCD panel according to claim 10, wherein in a second direction, an odd number of the plurality of second subpixel units are disposed between adjacent two of the first subpixel units; and the one or more second electrodes of one of the adjacent two first subpixel units are the pixel electrodes, the first electrode of the one of the adjacent two first subpixel units is one of the common electrodes; the one or more second electrodes of an other of the adjacent two first subpixel units are the common electrodes, and the first electrode of the other of the adjacent two first subpixel units is one of the pixel electrodes.

* * * * *